United States Patent
Yonezawa et al.

(10) Patent No.: US 6,205,652 B1
(45) Date of Patent: Mar. 27, 2001

(54) VACUUM COUPLING SYSTEM

(75) Inventors: Toshihiro Yonezawa; Hiroshi Tsukada, both of Kitakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/323,643

(22) Filed: Jun. 1, 1999

(30) Foreign Application Priority Data

Jun. 2, 1998 (JP) .................................................. 10-169207

(51) Int. Cl.⁷ .............................. B23Q 3/00; H01L 21/66
(52) U.S. Cl. .......................... 29/743; 324/754; 324/758; 414/737; 483/19; 901/45
(58) Field of Search .............................. 483/901, 14, 19; 901/45, 40; 414/217, 217.1, 744.3, 331, 737; 324/760, 766, 719, 758, 754; 29/846, 743

(56) References Cited

U.S. PATENT DOCUMENTS

| | | | |
|---|---|---|---|
| 3,902,615 | * 9/1975 | Lent et al. ........................... | 474/331 |
| 4,755,746 | * 7/1988 | Mallory et al. ....................... | 324/760 |
| 4,851,101 | * 7/1989 | Hutchinson ........................... | 414/217 |
| 5,479,108 | * 12/1995 | Cheng ................................... | 324/765 |
| 6,024,629 | * 2/2000 | Takehoshi ............................. | 324/758 |
| 6,034,524 | * 3/2000 | Barringer et al. .................... | 324/754 |

FOREIGN PATENT DOCUMENTS

| | | |
|---|---|---|
| 7-231019 | 8/1995 | (JP) . |
| 8-5666 | 1/1996 | (JP) . |
| 8-340330 | 12/1996 | (JP) . |

* cited by examiner

*Primary Examiner*—William Briggs
(74) *Attorney, Agent, or Firm*—Morrison & Foerster

(57) ABSTRACT

A vacuum coupling system according to the present invention is a mechanism that is used accurately to position and connect a vacuum coupling to a valve mechanism of a shell, which is formed by integrally attracting a wafer and a contactor to a wafer chuck by vacuum suction, in conducting a reliability test or other tests on IC chips that is formed on the wafer. This system comprises an air cylinder for advancing the vacuum coupling toward the valve mechanism, a positioning member to be advanced together with the vacuum coupling, a guide member for guiding the vacuum coupling to the valve mechanism in cooperation with the positioning member, a guide rail for guiding the around the wafer chuck while the positioning member is advancing, and a pair of POGO pins for returning the air cylinder to its neutral position.

24 Claims, 8 Drawing Sheets

VACUUM COUPLING SYSTEM

BACKGROUND OF THE INVENTION

The present invention relates to a vacuum coupling system, and more specifically, to a vacuum coupling system for connecting a vacuum coupling to a valve mechanism of an integral structure (hereinafter referred to as "shell") formed by uniting a semiconductor wafer (hereinafter referred to as "wafer"), a contactor, and a wafer holder (hereinafter referred to as "water chuck" by vacuum suction. Further specifically, the invention relates to a vacuum coupling system for connecting a vacuum coupling to a valve mechanism of a shell, which is formed by attracting a wafer and a contactor on a wafer chuck by vacuum suction, in conducting various tests on a semiconductor device (hereinafter referred to as "IC chip") that is formed on the wafer.

In a conventional reliability test, potential defects in packaged IC chips are detected by applying thermal and electrical stresses to the chips so that defective IC chips can be removed. With the development of smaller-sized, higher-function electrical equipment, IC chips have been miniaturized and enhanced in the degree of integration. Recently, there have been developed various mounting techniques for further miniaturization of semiconductor products. For example, a novel mounting technique has been developed for mounting unpackaged or bare IC chips.

Bare chips to be put on the market should be subjected to a reliability test. Conventional reliability testers have some problems on electrical connections between bare chips and sockets, for example. Besides, handling small bare chips is very troublesome and possibly entails an increase in testing cost.

Reliability testing techniques for testing IC chips on a wafer are proposed in Jpn. Pat. Appln. KOKAI Publications Nos. 7-231019, 8-5666, and 8-340030, for example. According to the techniques proposed in the former two publications, wafers and contactors, such as probe sheets, are securely collectively brought into contact with one another to be united without being thermally affected. Each contactor includes a contact terminal that electrically touches predetermined electrodes of a plurality of IC chips on each wafer and an external terminal connected to the contact terminal. The contactor is stuck fast on the wafer so that the contact terminal is in contact with the predetermined electrodes.

In an electrical property test or reliability test for IC chips on a wafer, it is essential to form and maintain the shell in which the contactor, wafer, and wafer holder are securely united together.

Conventionally, various techniques are proposed as methods for collectively bringing wafers and contactors into contact with one another. However, there is no practical apparatus for automatically loading shells into a reliability tester.

The inventor hereof proposed, in Jpn. Pat. Appln. Publication No. 9-318920, a wafer temperature control device and a wafer storage chamber that can maintain a given testing temperature to improve the reliability of a reliability test. However, a technique for automatically loading shells into the wafer storage chamber to automate the reliability test is on its way to development.

BRIEF SUMMARY OF THE INVENTION

The present invention has been contrived in consideration of these circumstances, and its object is to provide a vacuum coupling system for securely connecting a shell and a vacuum exhaust device in an apparatus for forming shells and an apparatus for automatically loading the shells into various test chambers or treatment chambers.

In a first aspect of the present invention, there is provided a vacuum coupling system, which comprises: a valve mechanism attached to a vacuum suction mechanism of a wafer holder attracting a semiconductor wafer and a contactor by vacuum suction so that the wafer holder, semiconductor wafer, and contactor form an integral structure; a vacuum coupling removably attached to the valve mechanism to connect the vacuum suction mechanism to a vacuum exhaust device; a movement drive mechanism for moving the vacuum coupling relatively to the valve mechanism so that the vacuum coupling is attached to and detached from the valve mechanism; and a vacuum coupling positioning mechanism for allowing the movement drive mechanism to move the vacuum coupling relatively to the valve mechanism. The positioning mechanism includes a guide member attached to the wafer holder, a positioning member attached to the movement drive mechanism and guided by the guide member, and a support mechanism for the movement drive mechanism, designed automatically to regulate the position of the movement drive mechanism in response to the movement of the positioning member guided by the guide member, thereby adjusting the position of the vacuum coupling with the valve mechanism.

In a second aspect of the invention, there is provided a vacuum coupling system, which comprises: a valve mechanism attached to a vacuum suction mechanism of a wafer holder attracting a semiconductor wafer and a contactor by vacuum suction so that the wafer holder, semiconductor wafer, and contactor form an integral structure; a vacuum coupling removably attached to the valve mechanism to connect the vacuum suction mechanism to a vacuum exhaust device; a movement drive mechanism for moving the vacuum coupling relatively to the valve mechanism so that the vacuum coupling is attached to or detached from the valve mechanism; and a vacuum coupling positioning mechanism for aligning the vacuum coupling with the valve mechanism on a plane to allow the movement drive mechanism to move the vacuum coupling relatively to the valve mechanism. The positioning mechanism including a guide member attached to the wafer holder, a positioning member attached to the movement drive mechanism and guided by the guide member, and a support mechanism for the movement drive mechanism, designed automatically to regulate the position of the movement drive mechanism in response to the movement of the positioning member guided by the guide member, thereby adjusting the position of the vacuum coupling with the valve mechanism.

Preferably, the guide member of the vacuum coupling system is a structure having a recess in the center thereof and taper surfaces spreading outward from the recess, and the positioning member includes at least one roller capable of rolling along the taper surfaces of the guide member and having a diameter such that the roller can be fitted in the recess.

Preferably, moreover, the support mechanism of the movement drive mechanism of the vacuum coupling system includes a guide mechanism for guiding the movement drive mechanism in movement on the circumference of a circle around the valve mechanism, and a centering mechanism for urging the movement drive mechanism, moving guided by the guide mechanism, to return to a neutral position.

Preferably, moreover, the guide mechanism of the vacuum coupling system includes a guide roller fixed to the movement drive mechanism and a guide rail having a groove allowing the guide roller to move therein.

Preferably, furthermore, the guide member of the vacuum coupling system is a structure having a recess in the center thereof and taper surfaces spreading outward from the recess, and the positioning member includes at least one roller capable of rolling along the taper surfaces of the guide member and having a diameter such that the roller can be fitted in the recess of the guide member.

In a third aspect of the invention, there is provided a vacuum coupling system, which comprises: a valve mechanism attached to a vacuum suction mechanism of a wafer holder attracting a semiconductor wafer and a contactor by vacuum suction so that the wafer holder, semiconductor wafer, and contactor form an integral structure; a vacuum coupling removably attached to the valve mechanism to connect the vacuum suction mechanism to a vacuum exhaust device; a movement drive mechanism for moving the vacuum coupling relatively to the valve mechanism so that the vacuum coupling is attached to or detached from the valve mechanism; and a vacuum coupling positioning mechanism for aligning the vacuum coupling with the valve mechanism along one plane and another plane perpendicular thereto to allow the movement drive mechanism to move the vacuum coupling relatively to the valve mechanism. The positioning mechanism includes a guide member attached to the wafer holder, a positioning member attached to the movement drive mechanism and guided by the guide member, and a support mechanism for the movement drive mechanism, designed automatically to regulate the position of the movement drive mechanism in response to the movement of the positioning member guided by the guide member, thereby adjusting the position of the vacuum coupling with the valve mechanism.

Preferably, the guide member of the vacuum coupling system includes a recess formed in the central portion thereof, a first taper surface spreading outward from the recess and serving for alignment on the one plane, and a second taper surface perpendicular to the first taper surface and serving for alignment on the other plane, and the positioning member includes at least one first roller, capable of rolling along the first taper surface of the guide member and having a diameter such that the first roller can be fitted in the recess of the guide member, and at least one second roller capable of rolling along the second taper surface of the guide member.

Preferably, moreover, the guide member of the vacuum coupling system includes a recess formed in the central portion thereof, a taper surface spreading outward from the recess, and a guide groove formed in the taper surface and the recess, and the positioning member includes at least one first roller, capable of rolling along the taper surface of the guide member and having a diameter such that the first roller can be fitted in the recess of the guide member, and a second roller capable of rolling in the guide groove of the guide member.

Preferably, moreover, the support mechanism of the movement drive mechanism of the vacuum coupling system includes a beam member having one end fixed to the movement drive mechanism, a rotary support mechanism having a rotating shaft for rotatably supporting the other end of the beam member so that the movement drive mechanism can rotate on the circumference of the circle around the valve mechanism, a rectilinear movement mechanism for supporting the beam member so that the beam member can move along the other plane, and a centering mechanism for urging the movement drive mechanism, rotating supported by the rotary support mechanism, to return to a neutral position.

Preferably, moreover, the rectilinear movement mechanism of the vacuum coupling system includes a rail mechanism for enabling the vacuum coupling to move vertically along the connecting member.

Preferably, furthermore, the rectilinear movement mechanism of the vacuum coupling system is obtained by forming the beam member of an elastic material.

Preferably, the centering mechanism of the vacuum coupling system is composed of a set of coil springs wound around the rotating shaft of the rotary support mechanism in opposite directions.

Preferably, moreover, the vacuum coupling system is used in at least one of tests including an electrical property test and a reliability test on a plurality of semiconductor devices formed on a semiconductor wafer.

Preferably, in the second and third aspects, two rollers are arranged longitudinally in the direction of movement of the positioning member toward the valve mechanism.

Preferably, in the second and third aspects, the centering mechanism of the vacuum coupling system includes at least a pair of elastic pressure applying mechanisms individually in unloaded contact with the opposite side faces of the movement drive mechanism in the neutral position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention relates to a vacuum coupling system for securely connecting a shell and a vacuum exhaust device in a shell forming apparatus and an apparatus for automatically mounting the shell in various test chambers or treatment chambers. The technique of the invention is not limited to a vacuum coupling system in a reliability tester. Referring now to FIGS. 1 to 9, however, there will be described an embodiment of the invention applied to a reliability tester.

Figure 1:
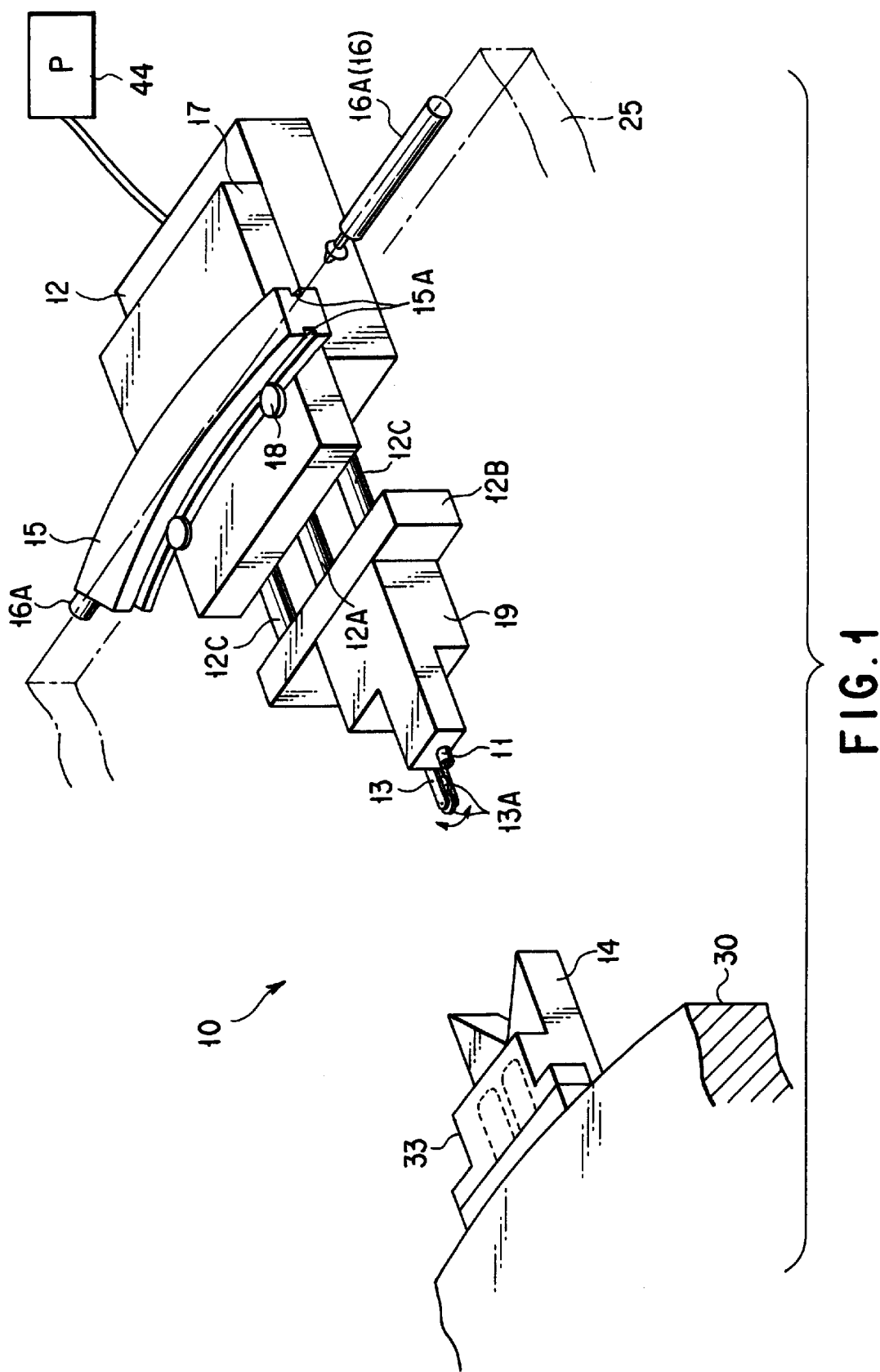
FIG. 1 is a perspective view showing an embodiment of a vacuum coupling system according to the present invention.

A vacuum coupling system 10 according to the present embodiment is constructed in the manner shown in FIGS. 1 and 2, for example. The system 10 is provided in a reliability test chamber (hereinafter referred to simply as "test chamber") 20 shown in FIGS. 3 and 4. The vacuum coupling system 10 is used to align a vacuum coupling 11 with a valve mechanism 33 along one plane.

Even when a shell 30 is set in the test chamber 20 in a manner such that it is deviated by about ±3° from a reference position in the circumferential direction, the vacuum coupling system 10 according to the present embodiment can securely connect the shell 30 and a vacuum exhaust device (P) 44, and unites a contactor, wafer, and wafer chuck by means of vacuum sucking force, thereby forming the shell with reliability. A plurality of test chambers 20 can be formed individually on four sides of a reliability tester (not shown), top, bottom, left-hand, and right-hand sides. Reliability tests are simultaneously conducted on wafers in the test chambers 20, individually.

Figure 3:
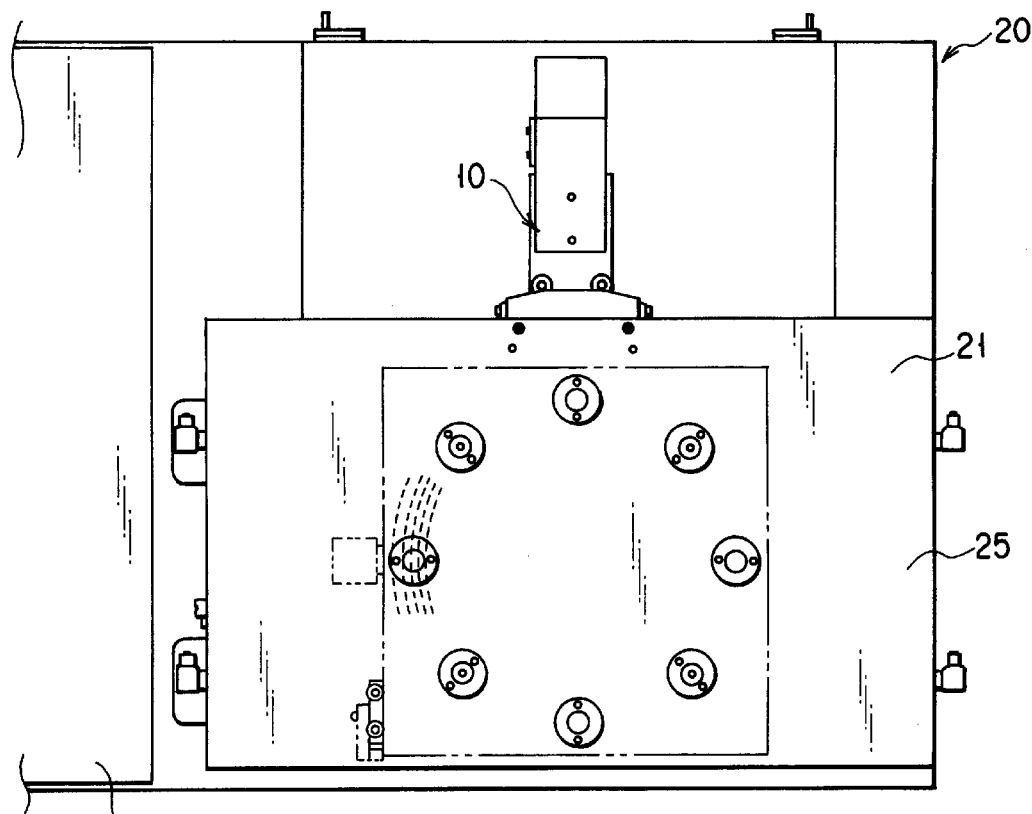
FIG. 3 is a plan view showing a test chamber of a reliability tester to which the vacuum coupling system of FIG. 1 is applied.
Figure 4:
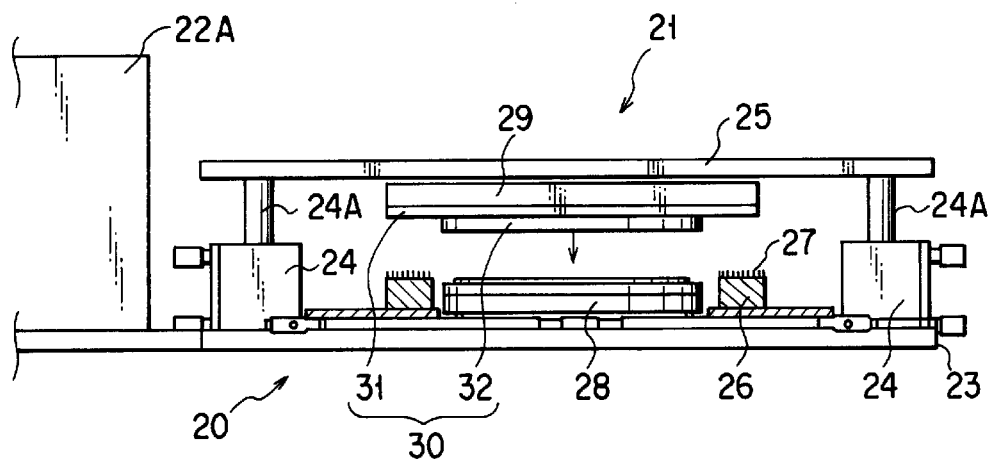
FIG. 4 is a front view of the test chamber shown in FIG. 3.

As shown in FIGS. 3 and 4, each test chamber 20 is provided with a temperature control chamber 21 for controlling the testing temperature of the shell 30 and a control chamber 22 adjacent to the chamber 21. The shell 30 in the temperature control chamber 21 is kept at the testing temperature by means of a control device 22A in the control chamber 22. Cylinder mechanisms 24 are arranged individually at the four corners of a base plate 23 of the temperature control chamber 21. The upper end of a cylinder rod 24A of each cylinder mechanism 24 is coupled to its corresponding one of the four corners of a pressure plate 25. A clamp mechanism (not shown), formed of a cylinder mechanism or the like, is provided on the back surface of the plate 25. The shell 30 is detachably received in the temperature control chamber 21 by means of the clamp mechanism.

Figure 5:
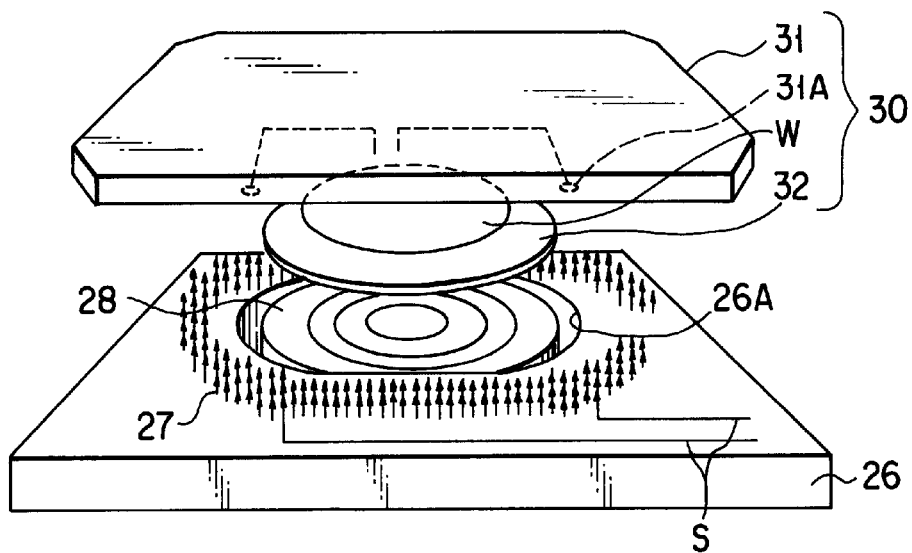
FIG. 5 is an exploded perspective view showing the relation between a shell and the test chamber shown in FIG. 4.

As shown in FIGS. 4 and 5, a frame 26 is located on the base plate 23. A circular hole 26A is formed substantially in the center of the frame 26. Arranged on the frame 26 are a large number of POGO pins 27 (e.g., 2,000 to 3,000 in number) in a plurality of rows, surrounding the hole 26A like a ring. As shown in FIGS. 4 to 6B, the shell 30 is an integral structure that is obtained by uniting a wafer W, a contactor 31 in contact with a testing electrode of the wafer W, and a wafer chuck 32 by means of vacuum sucking force. When the wafer W undergoes a reliability test, these three elements are united to form the shell 30, which is detachably set in each test chamber 20. A large number of external terminals 31A are arranged like a ring around bump terminals of the contactor 31. As the POGO pins 27 touch the external terminals 31A, the bump terminals are connected electrically to the terminals 31A. When the wafer W and the contactor 31 are joined together, the respective testing electrode pads of a large number of IC chips that are formed all over the wafer and their corresponding bump terminals on the contactor 31 are individually in contact with one another.

As shown in FIGS. 4 and 5, a bottom jacket 28 is located inside the hole 26A of the frame 26. The top surface of the jacket 28 is substantially flush with that of the frame 26. The jacket 28 has a heater and a lower cooling jacket (not shown) therein. An upper cooling jacket 29 is attached to the pressure plate 25. The shell 30, sandwiched between the lower cooling jacket and the upper cooling jacket 29, is heated to a given testing temperature (e.g., 110° C.) as it is tested. The testing temperature is kept constant, although the shell temperature is urged to rise as the wafer W generates heat during the test.

Figure 6A:
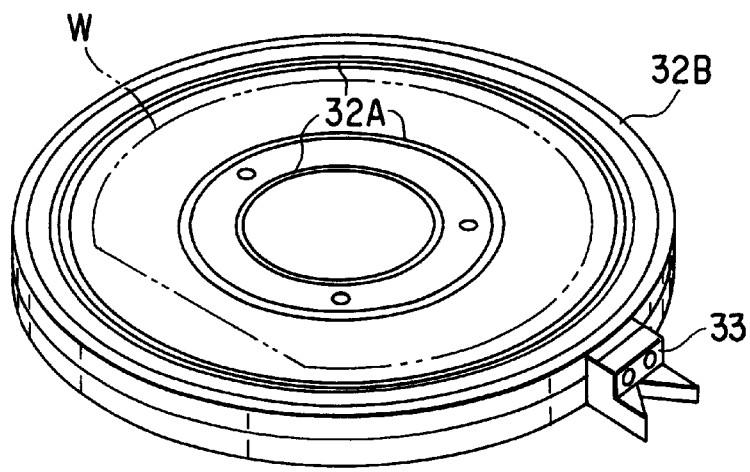
FIG. 6A is a perspective view showing a wafer chuck constituting the shell shown in FIG. 5.

As shown in FIG. 6A, concentric ring-shaped grooves 32A are formed in the top surface of the wafer chuck 32, and a seal member 32B is attached to the outer peripheral edge of the chuck 32. Each groove 32A communicates with an internal passage 32C (FIG. 6B) in the chuck 32. The peripheral surface of the wafer chuck 32 is fitted with the valve mechanism 33, which is coupled to the passage 32C. The ring-shaped groove 32A and the internal passage 32C constitute a vacuum suction mechanism. The vacuum exhaust device 44 (FIG. 1) is connected to the vacuum coupling 11 of the vacuum coupling system 10 according to the present embodiment. The valve mechanism 33 can be automatically closed or opened as the coupling 11 is inserted into or disengaged from the mechanism 33. Preferably, the valve mechanism according to the invention should be designed so that the internal passage 32C is automatically connected to and disconnected from the vacuum exhaust device 44 as the vacuum coupling 11 is inserted into or disengaged from the valve mechanism 33. Alternatively, however, the valve mechanism according to the invention may be further provided with a separate structure for connecting and disconnecting the internal passage.

When the valve mechanism 33 is fitted with the vacuum coupling 11 during the formation of the shell 30 or a test, such as the reliability test or electrical property test, the internal passage 32C is connected to the vacuum exhaust device 44, and vacuum sucking force is produced in the ring-shaped groove 32A that communicates with the passage 32C. This vacuum sucking force causes the wafer W and the contactor 31 to be attracted to the wafer chuck 32, whereupon the shell 30 is formed.

Figure 6B:
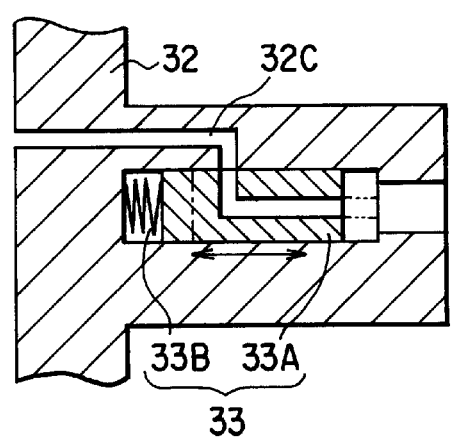
FIG. 6B is a sectional view showing a valve mechanism of the wafer chuck shown in FIG. 6A.

FIG. 6B shows an example of the valve mechanism 33 that is automatically closed or opened as the coupling 11 is inserted into or disengaged from it. As shown in FIG. 6B, the mechanism 33 has a valve member 33A and a spring 33B therein. When the vacuum coupling 11 is connected to the mechanism 33, it pushes in the valve member 33A, resisting the urging force of the spring 33B. Thereupon, the internal passage 32C communicates with the vacuum exhaust device 44 (FIG. 1) by means of the vacuum coupling 11. When the coupling 11 is disconnected from the valve mechanism 33, the valve member 33A is returned to its original position by the repulsive force of the spring 33B, so that the passage 32C is cut off from the exhaust device 44.

Referring now to FIGS. 1 and 2, the vacuum coupling system 10 according to the present embodiment will be described in detail. As shown in FIG. 1, the system 10 comprises the vacuum coupling 11 connected to the valve mechanism 33 of the wafer chuck 32, a positioning member 13, and a movement drive mechanism 12 for advancing and retreating the coupling 11 toward the valve mechanism 33. The vacuum coupling system 10 further comprises a guide member 14, arcuate guide rail 15, guide rollers 18, and a pair of centering mechanisms 16, left and right. The guide member 14, in conjunction with the positioning member 13, guides the vacuum coupling 11 to a position where it is connected to the valve mechanism 33. The guide rail 15 and the guide rollers 18 guide the movement drive mechanism 12 in circumferential movement around the valve mechanism 33 while the positioning member 13 is advancing toward the valve mechanism 33. The centering mechanisms 16 cause the drive mechanism 12, moved along the guide rail 15, to return to its neutral position.

The vacuum coupling system 10 is a system for aligning the vacuum coupling 11 with the valve mechanism 33 in a direction (hereinafter referred to as "transverse direction") along a plane that extends substantially parallel to the drawing plane. Thus, if the valve mechanism 33 of the wafer chuck 32 is deviated by about ±3° from the vacuum coupling 11 in the transverse direction, the vacuum coupling system 10 according to the invention can correct the deviation securely to connect the valve mechanism 33 and the vacuum coupling 11.

According to the present embodiment, an air cylinder is used as the movement drive mechanism 12. As shown in FIG. 1, the air cylinder 12 is supported by means of a support plate 17. The support plate 17 is a support mechanism for the movement drive mechanism. The cylinder 12 can move on a circular arc around the valve mechanism 33, aided by the guide rail 15 on the apparatus body, which cooperates with the guide rollers 18 that are fixed to the support plate 17.

More specifically, guide grooves 15A are formed individually in the opposite side faces of the guide rail 15. Four guide rollers 18 are arranged on either side of the guide rail 15. The guide rollers 18 are fitted in each guide groove 15A. The support plate 17 and the air cylinder 12 can reciprocate for about ±3° along the guide rail 15 on either side of their neutral position. The neutral position is a position in which the vacuum coupling 11 is in alignment with the valve mechanism 33 that is not dislocated. This neutral position can be adjusted to the place where an extension of the axis of the positioning member 13 passes through the center of a guide member for the wafer chuck 32 that is located accurately in a predetermined position on the bottom jacket 28.

When the air cylinder 12 is in its neutral position, the left- and right-hand centering mechanisms 16 are in unloaded contact with the left- and right-hand side faces of the cylinder 12, respectively. When the air cylinder 12 moves in one direction or to the left or right, the one centering mechanism 16 urges the air cylinder 12 to return to the neutral position. Although the centering mechanisms 16 act directly on their corresponding side faces of the cylinder 12 in this case, they may alternatively be designed to act on the support plate 17.

Figures 2A, 2B, 2C, 2D:
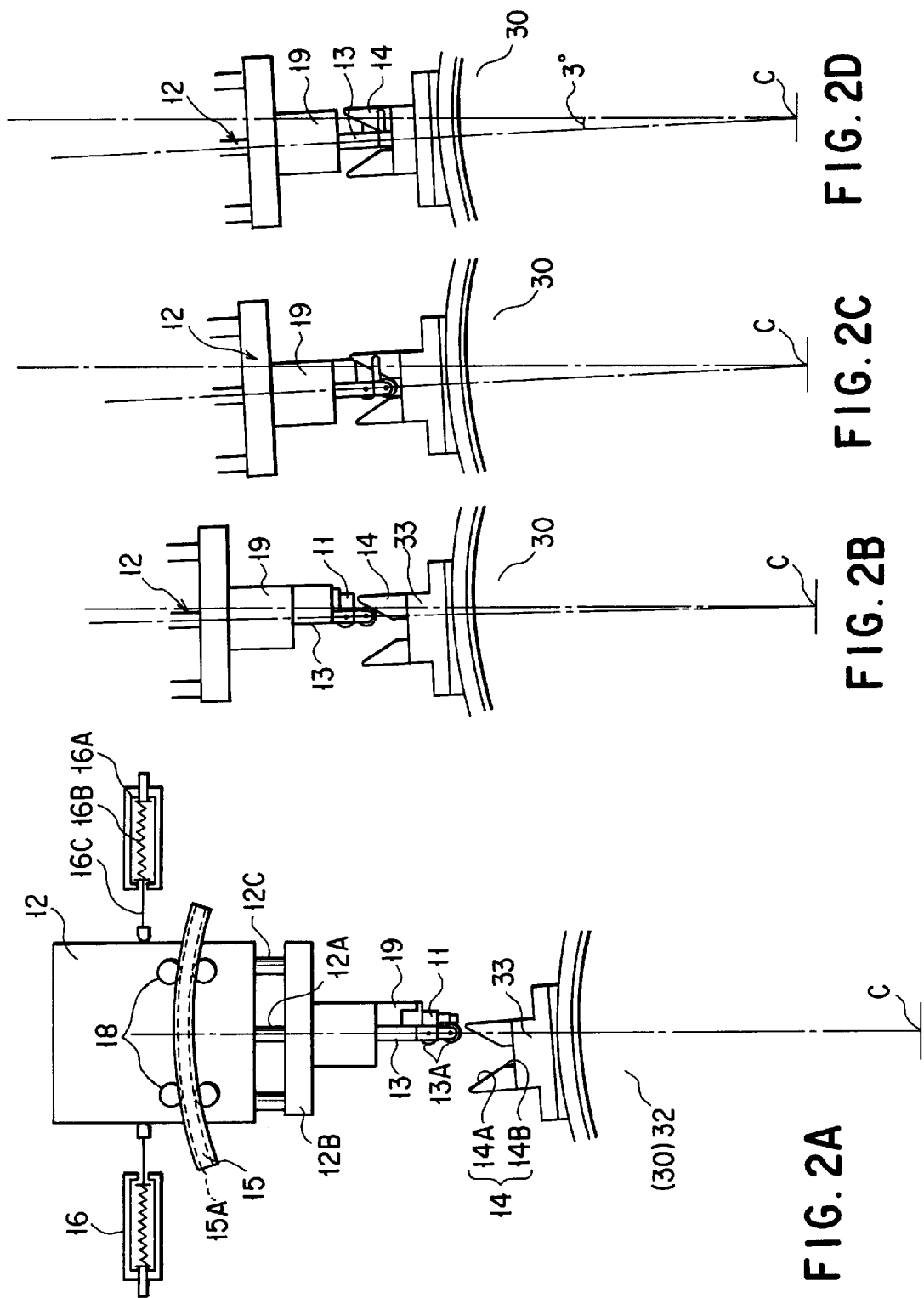
FIGS. 2A, 2B, 2C and 2D are diagrams for illustrating the operation of the vacuum coupling system shown in FIG. 1.

Each centering mechanism 16 may be composed of an elastic pressure applying mechanism. As shown in FIG. 2A, for example, this mechanism can be formed including a cylinder 16A, a coil spring 16B therein, and a rod 16C. The spring 16B causes the rod 16C to get into or out of the cylinder 16A.

In FIG. 1, the guide rollers 18 are mounted on the support plate 17. Alternatively, however, the support plate 17 may be omitted so that the rollers 18 are mounted directly on the air cylinder 12.

A connecting member 12B is attached to the distal end of a cylinder rod 12A of the air cylinder 12, and a pair of guide rods 12C are connected individually to the left- and right-hand portions of the connecting member 12B. The rods 12C can advance and retreat individually in guide holes (not shown) that are formed in the left- and right-hand portions of the air cylinder 12. The guide rods 12C are mechanisms that enable the cylinder rod 12A to advance straight without deflecting in any direction. A supporter 19 is mounted on the connecting member 12B. The positioning member 13 and the vacuum coupling 11 to be connected to the valve mechanism 33 are attached to the front face of the supporter 19.

The location of the positioning member 13 can be determined appropriately in relation to the guide member and the valve mechanism. Preferably, the positioning member 13 should be located a little below the vacuum coupling 11 and in the center of the supporter 19 in the transverse direction.

Figures 7A, 7B:
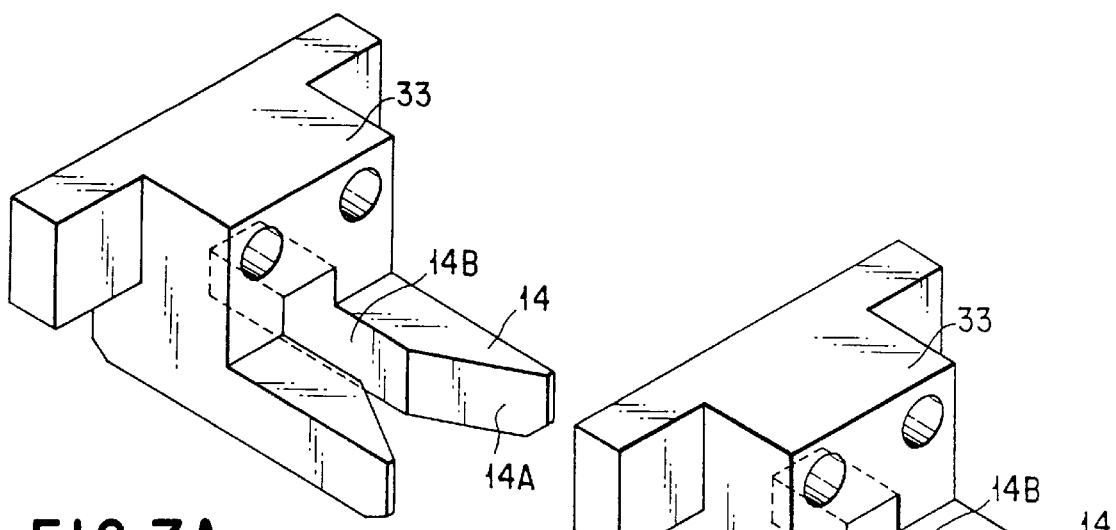
FIGS. 7A and 7B are perspective views individually showing guide members.

Rollers 13A are supported on the distal end portion of the positioning member 13 for rotation within a horizontal plane. Although only one roller 13A may be enough for the purpose, use of two rollers 13A is preferable. After the distal end of the positioning member 13 is moved along one of taper surfaces 14A of the guide member 14 by means of the rollers 13A, it gets into a groove 14B. As shown in FIGS. 1, 2 and 7A, the guide member 14 may have a pair of taper surfaces 14A, which form a substantially V-shaped symmetrical configuration, and the groove 14B. As shown in FIG. 7B, moreover, the taper surfaces of the member 14 may be formed substantially in the shape of a Y. Each taper surface may be flat or curved surface. The groove 14B has a size just large enough to receive the rollers 13A of the positioning member 13. If the rollers 13A are two in number, the distal end of the positioning member 13 can advance straight with higher performance as it falls into the groove 14B. In the arrangement described above, the vacuum coupling system 10 is provided with only one vacuum coupling 11. In the case where the valve mechanism 33 includes two or more valves, however, the coupling system 10 may be provided with two or more vacuum couplings 11 corresponding to the valves in number.

Figure 9:
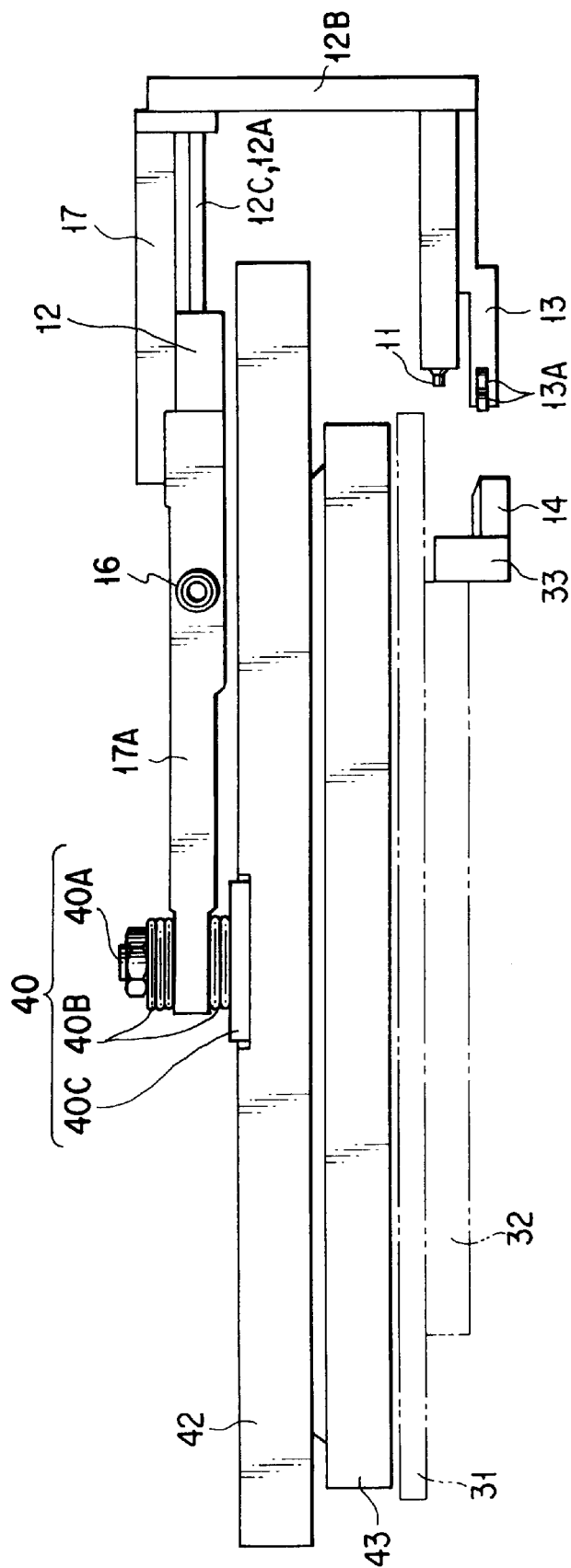
FIG. 9 is a perspective view showing still another embodiment of the vacuum coupling system of the invention.

FIG. 9 shows another embodiment of the invention related to the support mechanism for the movement drive mechanism. As shown in FIG. 9, a vacuum coupling system 10 comprises a vacuum coupling 11 connected to a valve mechanism 33 of a wafer chuck 32, a positioning member 13, and a movement drive mechanism 12 for advancing and retreating the vacuum coupling 11 and the positioning member 13 toward the valve mechanism 33. The vacuum coupling system 10 further comprises a guide member 14, support plate 17, beam member 17A, rotary support mechanism 40, and a pair of centering mechanisms 16, left and right. The guide member 14, in conjunction with the positioning member 13, guides the vacuum coupling 11 to a position where it is connected to the valve mechanism 33. The support plate 17 and the beam member 17A support the movement drive mechanism 12. The rotary support mechanism 40 supports the beam member 17A in a manner such that it can move the drive mechanism 12 in the circumferential direction around the valve mechanism 33. The centering mechanisms 16 cause the drive mechanism 12, moved by means of the rotary support mechanism 40, to return to its neutral position. The rotary support mechanism 40 is provided with a rotating shaft 40A and thrust bearings 40B.

The movement drive mechanism 12, like the one shown in FIG. 1, may be formed of an air cylinder.

Like the one shown in FIG. 1, moreover, the movement drive mechanism 12 is supported by means of the support plate 17. The support plate 17 and the beam member 17A constitute the support mechanism for supporting the movement drive mechanism 12. One end of the beam member 17A is supported for rotation around the rotating shaft 40A.

Although the centering mechanisms 16 are attached to the beam member 17A in the arrangement shown in FIG. 9, they may alternatively be provided on the support plate 17.

The following is a description of the operation of the system shown in FIGS. 1 to 8.

In the case where the wafer W is tested for reliability, the shell 30 is formed in a preliminary stage such that the contactor 31, wafer W, and wafer chuck 32 are united by vacuum suction. The shell 30 is transported to the reliability tester by means of an automatic conveyor and loaded into one of the test chambers 20 thereof. In the test chamber 20, the clamp mechanism receives the shell 30, and the cylinder mechanisms 24 then lower the pressure plate 25, whereupon the shell 30 is brought down as indicated by the arrow in FIG. 4. The shell 30 is held between the bottom jacket 28 and the upper jacket 29, and the external terminals 31A of the contactor 31 are brought into electrical contact with their corresponding POGO pins 27. In some cases, the contactor 31 and the wafer chuck 32 may be somewhat deviated from their predetermined positions when the contactor 31, wafer W, and chuck 32 are united in the aforesaid preliminary stage. Accordingly, the center of the valve mechanism 33 of the shell 30 that is transported by the automatic conveyor is situated in a position deviated from the extension of the axis (dashed line in FIG. 2A) of the positioning member 13, as shown in FIG. 2A. Possibly, this dislocation may be a circumferential dislocation of ±3° at the maximum, for example. In FIGS. 2A to 2D, the guide rail 15 and the guide rollers 18 are omitted.

Thus, even in the case where the shell 30 is somewhat dislocated as it is loaded into the test chamber 20, the vacuum coupling system 10 according to the present embodiment can securely align and connect the vacuum coupling 11 with the valve mechanism 33 of the shell 30.

As shown in FIG. 2A, the cylinder rod 12A is caused to advance from its neutral position by the air cylinder 12 of the vacuum coupling system 10 under the guide of the guide rods 12C. The vacuum coupling 11 also advances straight toward the shell 30. The rollers 13A of the positioning member 13 engage one of the taper surfaces 14A of the guide member 14. As the vacuum coupling 11 continues to advance straight pushed by the air cylinder 12, the rollers 13A roll along the taper surface 14A to approach the center of the valve mechanism 33. As this is done, the guide rail 15 and the guide rollers 18 cooperate gradually to move the air cylinder 12 counterclockwise from the neutral position, resisting the urging force of the centering mechanisms 16. Then, the rollers 13A of the positioning member 13 reach the groove 14B of the guide member 14, as shown in FIG. 2C. Thereupon, the vacuum coupling 11 reaches the position for connection with the valve mechanism 33.

When the positioning member 13 is further caused to advance straight by the air cylinder 12, the rollers 13A get into the groove 14B, and the vacuum coupling 11 is connected to the valve mechanism 33, as shown in FIG. 2D. The valve member 33A is pushed in, and the internal passage 32C of the wafer chuck 32 is connected to the vacuum exhaust device 44. Thereupon, the passage 32C is evacuated by the vacuum exhaust device 44, so that vacuum sucking force is generated or enhanced in the shell 30. Thus, the three elements of the shell 30 are united more securely, and the bump terminals of the contactor 31 are securely connected to their corresponding electrode pads of the wafer W.

When the reliability test is finished, the air cylinder 12 is driven in the opposite direction, so that the positioning member 13 and the vacuum coupling 11 are disengaged from the valve mechanism 33. The valve member 33A of the valve mechanism 33 is returned to its original position by the spring 33B, whereupon the internal passage 32C of the wafer chuck 32 is cut off from the outside. Thus, a vacuum is kept between the chuck 32 and the contactor 31, and the unity of the three elements of the shell 30 is maintained.

When the vacuum coupling 11 is disengaged from the valve mechanism 33, the air cylinder 12 is returned along the guide rail 15 to the neutral position by urging force from the left-hand centering mechanism 16. The cylinder mechanisms 24 in the test chamber 20 are actuated to lift the shell 30 above the bottom jacket 28, and the shell 30 is then carried out from the test chamber 20.

The following is a description of the operation of the alternative embodiment related to the support mechanism for the movement drive mechanism shown in FIG. 9. The cylinder rod 12A is caused to advance toward the valve mechanism by the air cylinder 12 of the vacuum coupling system 10. As in the case shown in FIG. 2B, the first roller 13A of the positioning member 13 engages one of the taper surfaces 14A of the guide member 14 and rolls thereon. The first roller 13A and the taper surface 14A cooperate to cause the positioning member 13 gradually to move the air cylinder 12 clockwise or counterclockwise from the neutral position, resisting the urging force of the centering mechanisms 16, so that the vacuum coupling is positioned corresponding to the valve mechanism 33. This movement of the cylinder 12 is achieved by the agency of the rotary support mechanism 40 that supports the beam member 17A and the support plate 17 for rotation.

According to the present embodiment shown in FIGS. 1 to 9, as described above, the vacuum coupling 11 is guided to the position for connection with the valve mechanism 33 by the positioning member 13 and the guide member 14 as it is connected to the valve mechanism 33 by means of the air cylinder 12. Since the air cylinder 12 is movable along the guide rail 15, the vacuum coupling 11 can be securely connected to the valve mechanism 33 even if the valve mechanism 33 is somewhat deviated from the position for connection with the vacuum coupling 11.

The air cylinder 12 that moves along the guide rail 15 is located in its neutral position by means of the pair of centering mechanisms 16. When the vacuum coupling 11 is disconnected from the valve mechanism 33, the centering mechanisms 16 never fail to return the air cylinder 12 to the neutral position. Thus, the centering mechanisms 16 are unloaded, so that their life performance is improved.

The positioning member 13 has at least one rotatable roller 13A on its distal end, and the guide member 14 has the groove 14B in which the rollers 13A are fitted and the paired taper surfaces 14A that spread the groove 14B left and right. Thus, the positioning member 13 can smoothly advance guided by the guide member 14, so that the vacuum coupling 11 can be smoothly connected to the valve mechanism 33.

The air cylinder 12 is provided with a positioning mechanism including the rotatable rollers 18 that can engage the guide rail 15. As the positioning member 13 advances straight, therefore, the air cylinder 12 moves smoothly from its neutral position, and the vacuum coupling 11 can be smoothly connected to the valve mechanism 33.

The centering mechanisms 16, which includes a spring each, can be manufactured at low cost.

Since the guide member 14 is located under the valve mechanism 33, the vacuum coupling system 10 can enjoy a compact structure.

Referring now to FIGS. 10 to 14, there will be described a vacuum coupling system 10 that aligns a vacuum coupling 11 with a valve mechanism 33 three-dimensionally, that is, not only in the direction (transverse direction) along the aforesaid plane but also in a direction (hereinafter referred to as "vertical direction") perpendicular to the plane. In the description to follow, like reference numerals are used to designate components that have the same functions as their counterparts shown in FIGS. 1 to 8, and a detailed description of those components is omitted.

The vacuum coupling system 10 shown in FIG. 1 is a system for aligning the vacuum coupling 11 with the valve mechanism 33 in the transverse direction. This system is applicable to the case where the vertical dislocation of the valve mechanism 33 of the shell 30 in the test chamber, with respect to the vacuum coupling 11, is not substantial.

However, a vertical dislocation that exceeds a given value must be corrected.

FIGS. 10 to 14 show an embodiment of the vacuum coupling system 10 in which the vertical dislocation can be corrected.

Figure 10:
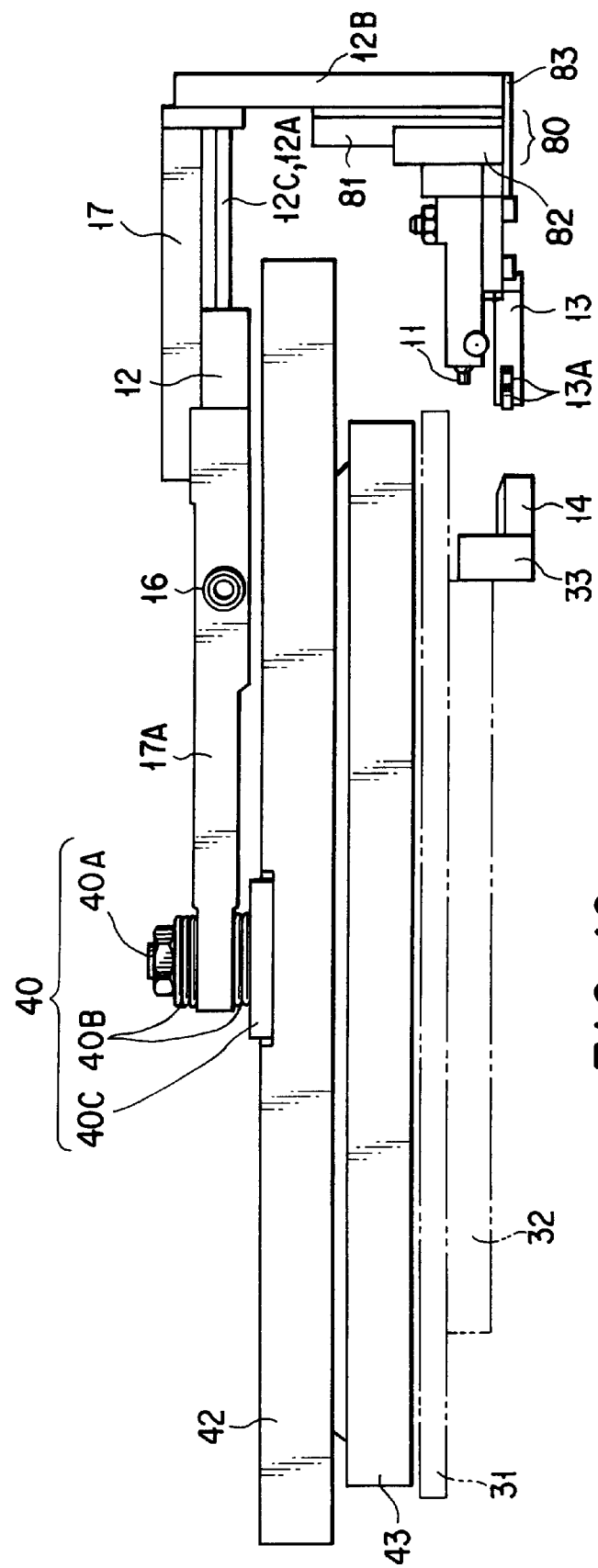
FIG. 10 is a perspective view showing a further embodiment of the vacuum coupling system of the invention.

As shown in FIG. 10, the vacuum coupling system 10 comprises a vacuum coupling 11 connected to a valve mechanism 33 of a wafer chuck 32, a positioning member 13, and a movement drive mechanism 12 for advancing and retreating the coupling 11 and the positioning member 13 toward the valve mechanism 33. The vacuum coupling system 10 further comprises a guide member 14, rotary support mechanism 40, and a pair of centering mechanisms 16, left and right. The guide member 14, in conjunction with the positioning member 13, guides the vacuum coupling 11 to a position where it is connected to the valve mechanism 33. The rotary support mechanism 40 guides the movement drive mechanism 12 in movement along a circular arc around the valve mechanism 33 while the positioning member 13 is advancing toward the valve mechanism 33. The centering mechanisms 16 cause the drive mechanism 12, moved by means of the support mechanism 40, to return to its neutral position.

The movement drive mechanism 12, like the one shown in FIG. 1, may be formed of an air cylinder.

Like the one shown in FIG. 1, moreover, the movement drive mechanism 12 is supported by means of a support plate 17. The support plate 17 and a beam member 17A constitute a support mechanism for supporting the movement drive mechanism 12. One end of the beam member 17A is supported for rotation around a rotating shaft 40A.

Further, a connecting member 12B is provided with a rectilinear movement support mechanism 80 for enabling the vacuum coupling and the positioning member 13 to move in the vertical direction. A rail mechanism may be used as the support mechanism 80. The rail mechanism 80 is a mechanism in which a truck 82 vertically moves along a fixed rail 81. Numeral 83 denotes a stopper.

The beam member 17A is fitted with the centering mechanisms 16, which is similar to the ones shown in FIG. 1.

Although the centering mechanisms 16 are attached to the beam member 17A shown in FIG. 10, they may alternatively be attached to the support plate 17.

Figure 11:
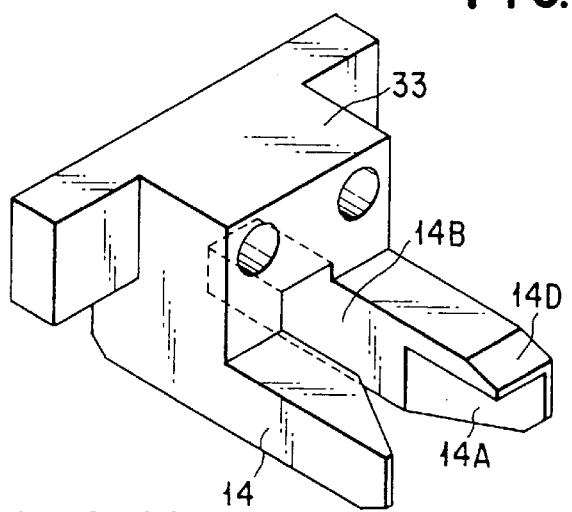
FIG. 11 is a perspective view showing another guide member.

FIG. 11 shows another example of the guide member 14. As shown in FIG. 11, the guide member 14 includes first taper surfaces 14A, which form a substantially V-shaped symmetrical configuration, and a groove 14B. The groove 14B has a size just large enough to receive first rollers 13A (mentioned later) of the positioning member 13. The first taper surfaces 14A are guide surfaces for aligning the vacuum coupling 11 with the valve mechanism 33 in the transverse direction. The guide member 14 is formed further having a second taper surface 14D. The second taper surface 14D is a guide surface that, in conjunction with a second roller 13B (mentioned later), corrects the vertical dislocation between the vacuum coupling 11 and the valve mechanism 33.

Figure 13:
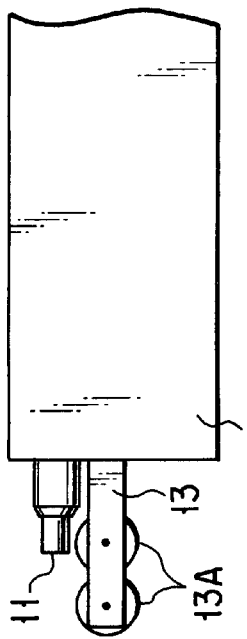
FIG. 13 is a plan view showing the positioning member and the vacuum coupling of the vacuum coupling system.
Figure 12:
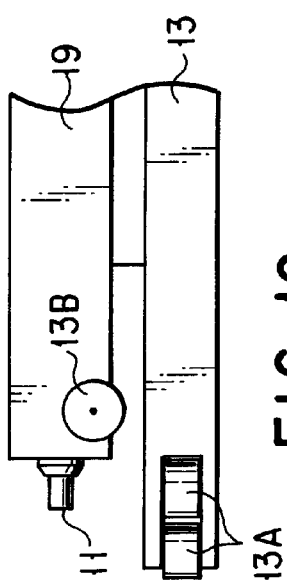
FIG. 12 is a side view showing a positioning member and a vacuum coupling of the vacuum coupling system.

FIGS. 12 and 13 show the positioning member 13 having the first rollers 13A and a supporter 19 of the vacuum coupling 11 that is provided with the second roller 13B. Although the second roller 13B is mounted on the supporter 19 in this case, it may alternatively be mount on a second positioning member that is provided separately.

The rollers 13A, which is rotatably mounted on the positioning member 13, can roll on the first taper surfaces 14A (FIG. 11) of the guide member 14. The first rollers 13A serve to align the vacuum coupling with the valve mechanism in the transverse direction. Although only one first roller 13A may be enough for the purpose, use of two rollers 13A is preferable. The second roller 13B, which is rotatably mounted on the supporter 19 of the vacuum coupling 11, rolls on the second taper surface 14D (FIG. 11). The second roller 13B serves to correct the vertical dislocation of the vacuum coupling, thereby aligning it with the valve mechanism. In the arrangement described above, the vacuum coupling system 10 is provided with only one vacuum coupling 11. In the case where the valve mechanism 33 includes two or more valves, however, the coupling system 10 may be provided with two or more vacuum couplings 11 corresponding to the valves in number.

Figure 14:
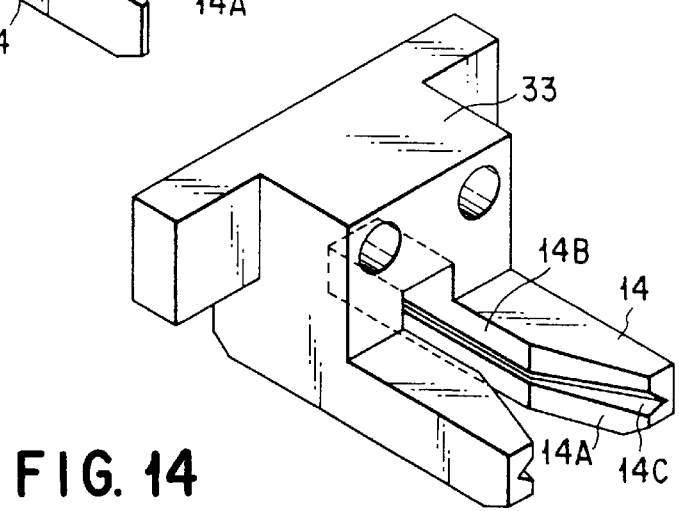
FIG. 14 is a perspective view showing still another guide member.

FIG. 14 shows still another example of the guide member 14. This guide member 14 has first taper surfaces 14A that resemble those of the guide member shown in FIG. 11. Corresponding to the taper surfaces 14A, rollers 13A are rotatably mounted on the positioning member 13 (FIG. 12). Further, a groove 14C is formed in each of the taper surfaces 14A. The groove 14C, in conjunction with the rollers 13A on the positioning member 13, aligns the vacuum coupling in the vertical direction. The guide member 14 shown in FIG. 14 need not be provided with a second roller 13B.

The vacuum coupling system 10 shown in FIG. 9 is not provided with a rectilinear movement support mechanism 80, such as the one shown in FIG. 10. In this coupling system 10, a beam member 17A is movable in the transverse direction on the circumference of a circle around the valve mechanism. If the beam member 17A of the coupling system 10 is formed of a member that is elastic in the vertical direction, however, it can enjoy the aforementioned function for rectilinear movement itself. Thus, as the positioning member corrects the vertical dislocation of the vacuum coupling, the beam member receives upward or downward tremors by means of its own elasticity, thereby canceling the vertical dislocation between the vacuum coupling and the valve mechanism.

The following is a description of the operation of the system shown in FIGS. 10 to 14.

A shell 30, which is formed by uniting a contactor 31, wafer W, and wafer chuck 32 by vacuum suction, is transported to the reliability tester by means of the automatic conveyor and loaded into one of the test chambers 20 thereof. In the test chamber 20, the shell 30 is held between the bottom jacket 28 and the upper jacket 29, and external terminals 31A of the contactor 31 are brought into electrical contact with their corresponding POGO pins 27.

Thus, even in the case where the shell 30 is somewhat dislocated in the transverse and vertical directions as it is loaded into the test chamber 20, the vacuum coupling system 10 according to the present embodiment can securely align and connect the vacuum coupling 11 with the valve mechanism 33 of the shell 30.

A cylinder rod 12A is caused to advance by the air cylinder 12 of the vacuum coupling system 10 under the guide of guide rods 12C. The vacuum coupling 11 also advances toward the shell 30. As in the case of FIG. 2B, the first rollers 13A (FIGS. 12 and 13) of the positioning member 13 engage and roll on the first taper surfaces 14A of the guide member 14 (FIG. 11), while the second roller 13B engages and rolls on the second taper surface 14D. As the first and second rollers 13A and 13B cooperate with the first and second taper surfaces 14A and 14D, respectively, the positioning member 13 is aligned with the valve mechanism 33 in the transverse and vertical directions.

As this is done, the rotary support mechanism 40 causes gradually to move the air cylinder 12 clockwise or counterclockwise from its neutral position, resisting the urging force of the centering mechanisms 16. Then, the rollers 13A of the positioning member 13 reach the groove 14B of the guide member 14, as in the case of FIG. 2C. Thereupon, the vacuum coupling 11 reaches the position for connection with the valve mechanism 33. When the positioning member 13 is further caused to advance straight by the air cylinder 12, the rollers 13A get into the groove 14B, and the vacuum coupling 11 is connected to the valve mechanism 33, as in the case of FIG. 2D. The valve member 33A is pushed in, and the internal passage 32C of the wafer chuck 32 is connected to the vacuum exhaust device 44.

When the reliability test is finished, the air cylinder 12 is driven in the opposite direction, so that the positioning member 13 and the vacuum coupling 11 are disengaged from the valve mechanism 33. When the coupling 11 is disengaged from the valve mechanism 33, the air cylinder 12 is returned to its neutral position by urging force from the right- or left-hand centering mechanism 16. The cylinder mechanisms 24 in the test chamber 20 are actuated to lift the shell 30 above the bottom jacket 28, and the shell 30 is then carried out from the test chamber 20.

The following is a description of the operation carried out with use of the alternative guide member 14 shown in FIG. 14.

When the positioning member 13 advances straight toward the guide member 14, the rollers 13A first get into a wide portion of the groove 14C. Thus, the rollers 13A can be fitted into the groove 14C even when they are dislocated in the vertical direction. When the positioning member 13 further advances straight toward the guide member 14, the rollers 13A are aligned in the transverse direction by the taper surfaces 14A and guided along the groove 14C with respect to the vertical direction. When the rollers 13A reach the groove 14B, the alignment is completed with respect to both the direction along the aforesaid one plane and the vertical direction.

It is to be understood that the present invention is not limited to the embodiments described above, and that various changes and modifications may be effected therein by one skilled in the art without departing from the scope or spirit of the invention.

The air cylinder 12 shown in FIG. 1 has been described as a mechanism that can be moved by the cooperation of the guide rollers 18 and the guide rail 15. Alternatively, however, the movement drive mechanism may be designed to be movable on the guide rail. In this case, the guide rail need not be provided with any grooves on either side thereof.

Although the air cylinder is used as the movement drive mechanism 12 shown in FIG. 1, it may be replaced with an electrical drive mechanism or any other mechanical drive mechanism.

Each centering mechanism 16 shown in FIG. 1 is formed of a POGO pin that includes a spring. Alternatively, however, it may be formed of a mechanism that utilizes the tensile force of a coil spring, a compression mechanism utilizing pneumatic pressure, or a mechanism based on electromagnetic force.

The guide surfaces of the guide member may be substantially V-shaped taper surfaces 14A that extend toward the positioning member, as shown in FIG. 7A, substantially Y-shaped taper surfaces 14A, as shown in FIG. 7B, or any other surfaces that are shaped so as to be able to guide the rollers 13A smoothly. Each taper surface may be a flat surface, a grooved surface, such as the one shown in FIG. 14, a curved surface, such as the shown in FIG. 7B, or a surface having a projection.

Figure 8:
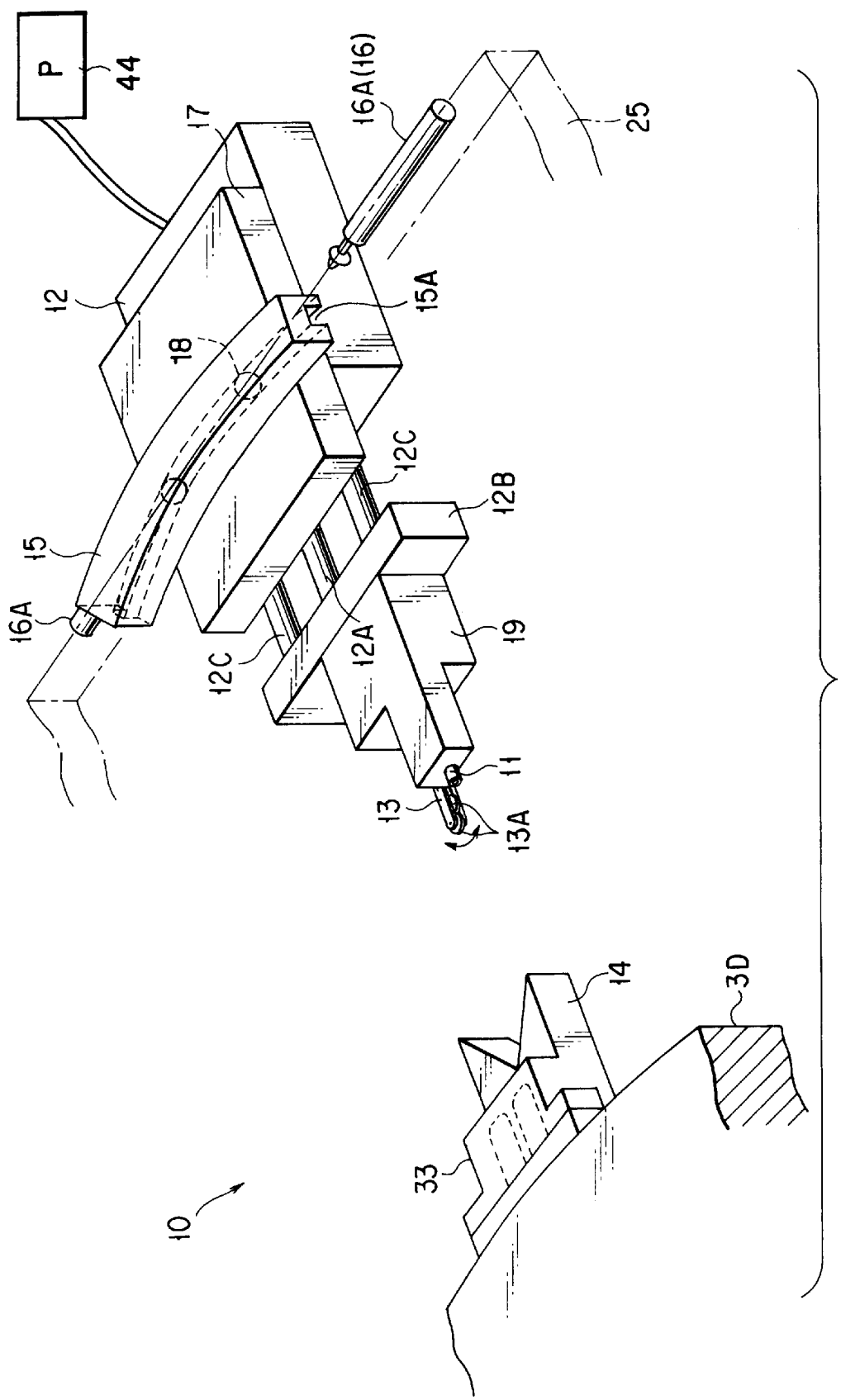
FIG. 8 is a perspective view showing another embodiment of the vacuum coupling system of the invention.

The arcuate guide rail 15 shown in FIG. 1 has a groove in each side face thereof, and the guide rollers 18 are fitted in the groove. As shown in FIG. 8, however, the arcuate guide rail 15 may be formed having a groove in its undersurface such that the guide rollers 18 can be fitted in the bottom groove.

Although the shell 30 is automatically loaded into the test chamber 20 according to the embodiments described above, moreover, it may alternatively be loaded by an operator.

Thus, according to the present invention described herein, the vacuum sucking force to unit the contactor, wafer, and wafer holder can be securely formed and maintained. Further, there may be provided a vacuum coupling system in which a shell can be securely connected to the vacuum exhaust device, thus ensuring a steady reliability test, even in the case where it is automatically loaded into a reliability test chamber.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vacuum coupling system comprising:
    a valve mechanism attached to a vacuum suction mechanism of a wafer holder attracting a semiconductor wafer and a contactor by vacuum suction so that the wafer holder, the semiconductor wafer, and the contactor form an integral structure;
    a vacuum coupling removably attached to the valve mechanism to connect the vacuum suction mechanism to a vacuum exhaust device;
    a movement drive mechanism for moving the vacuum coupling relatively to the valve mechanism so that the vacuum coupling is attached to and detached from the valve mechanism; and a vacuum coupling positioning mechanism for allowing the movement drive mechanism to move the vacuum coupling relatively to the valve mechanism, the vacuum coupling positioning mechanism including a guide member attached to the wafer holder, a positioning member attached to the movement drive mechanism and guided by the guide member, and a support mechanism for the movement drive mechanism, the support mechanism automatically regulating the position of the movement drive mechanism in response to the movement of the positioning member guided by the guide member, thereby adjusting the position of the vacuum coupling with the valve mechanism.

2. A vacuum coupling system comprising:

a valve mechanism attached to a vacuum suction mechanism of a wafer holder attracting a semiconductor wafer and a contactor by vacuum suction so that the wafer holder, a semiconductor wafer, and the contactor form an integral structure;

a vacuum coupling removably attached to the valve mechanism to connect the vacuum suction mechanism to a vacuum exhaust device;

a movement drive mechanism for moving the vacuum coupling relatively to the valve mechanism so that the vacuum coupling is attached to and detached from the valve mechanism; and a vacuum coupling positioning mechanism for aligning the vacuum coupling with the valve mechanism on a plane to allow the movement drive mechanism to move the vacuum coupling relatively to the valve mechanism, the vacuum coupling positioning mechanism including a guide member attached to the wafer holder, a positioning member attached to the movement drive mechanism and guided by the guide member, and a support mechanism for the movement drive mechanism, the support mechanism automatically regulating the position of the movement drive mechanism in response to the movement of the positioning member guided by the guide member, thereby adjusting the position of the vacuum coupling with the valve mechanism.

3. A vacuum coupling system according to claim 2, wherein said guide member is a structure having a recess in the center thereof and taper surfaces spreading outward from the recess, and said positioning member includes at least one roller capable of rolling along the taper surfaces of the guide member and having a diameter such that the roller can be fitted in the recess.

4. A vacuum coupling system according to claim 3, wherein two said rollers are arranged longitudinally in the direction of movement of the positioning member toward the valve mechanism.

5. A vacuum coupling system according to claim 2, wherein said support mechanism of said movement drive mechanism includes a guide mechanism for guiding the movement drive mechanism in movement on the circumference of a circle around the valve mechanism, and a centering mechanism for urging the movement drive mechanism, moving guided by the guide mechanism, to return to a neutral position.

6. A vacuum coupling system according to claim 5, wherein said guide mechanism includes a guide roller fixed to the movement drive mechanism and a guide rail having a groove allowing the guide roller to move therein, and said centering mechanism includes at least a pair of elastic pressure applying mechanisms individually in unloaded contact with the opposite side faces of the movement drive mechanism in the neutral position.

7. A vacuum coupling system according to claim 5, wherein said guide mechanism includes a beam member having one end fixed to the movement drive mechanism and a rotary support mechanism having a rotating shaft for rotatably supporting the other end of the beam member so that the movement drive mechanism can rotate on the circumference of the circle around the valve mechanism.

8. A vacuum coupling system according to claim 7, wherein said centering mechanism includes at least a pair of elastic pressure applying mechanisms individually in unloaded contact with the opposite side faces of the movement drive mechanism in the neutral position.

9. A vacuum coupling system according to claim 5, wherein said guide member is a structure having a recess in the center thereof and taper surfaces spreading outward from the recess, and said positioning member includes at least one roller capable of rolling along the taper surfaces of the guide member and having a diameter such that the roller can be fitted in the recess of the guide member.

10. A vacuum coupling system according to claim 5, wherein two said rollers are arranged longitudinally in the direction of movement of the positioning member toward the valve mechanism.

11. A vacuum coupling system comprising:

a valve mechanism attached to a vacuum suction mechanism of a wafer holder attracting a semiconductor wafer and a contactor by vacuum suction so that the wafer holder, the semiconductor wafer, and the contactor form an integral structure;

a vacuum coupling removably attached to the valve mechanism to connect the vacuum suction mechanism to a vacuum exhaust device;

a movement drive mechanism for moving the vacuum coupling relatively to the valve mechanism so that the vacuum coupling is attached to and detached from the valve mechanism; and a vacuum coupling positioning mechanism for aligning the vacuum coupling with the valve mechanism along one plane and another plane perpendicular thereto to allow the movement drive mechanism to move the vacuum coupling relatively to the valve mechanism, the vacuum coupling positioning mechanism including a guide member attached to the wafer holder, a positioning member attached to the movement drive mechanism and guided by the guide member, and a support mechanism for the movement drive mechanism, the support mechanism automatically regulating the position of the movement drive mechanism in response to the movement of the positioning member guided by the guide member, thereby adjusting the position of the vacuum coupling with the valve mechanism.

12. A vacuum coupling system according to claim 11, wherein said guide member includes a recess formed in the central portion thereof, a first taper surface spreading outward from the recess and serving for alignment on the one plane, and a second taper surface perpendicular to the first taper surface and serving for alignment on the other plane, and said positioning member includes at least one first roller, capable of rolling along the first taper surface of the guide member and having a diameter such that the first roller can be fitted in the recess of the guide member, and at least one second roller capable of rolling along the second taper surface of the guide member.

13. A vacuum coupling system according to claim 11, wherein said guide member includes a recess formed in the central portion thereof, a taper surface spreading outward from the recess, and a guide groove formed in the taper surface and the recess, and said positioning member includes at least one first roller, capable of rolling along the taper surface of the guide member and having a diameter such that the first roller can be fitted in the recess of the guide member, and a second roller capable of rolling in the guide groove of the guide member.

14. A vacuum coupling system according to claim 12 or 13, wherein two said first rollers are arranged longitudinally in the direction of movement of the positioning member toward the valve mechanism.

15. A vacuum coupling system according to claim 11, wherein said support mechanism of said movement drive mechanism includes a beam member having one end fixed to the movement drive mechanism, a rotary support mechanism having a rotating shaft for rotatably supporting the other end of the beam member so that the movement drive mechanism can rotate on the circumference of the circle around the valve mechanism, a rectilinear movement mechanism for supporting the beam member so that the beam member can move along the other plane, and a centering mechanism for urging the movement drive mechanism, rotating supported by the rotary support mechanism, to return to a neutral position.

16. A vacuum coupling system according to claim 15, wherein said rectilinear movement mechanism includes a rail mechanism for enabling the vacuum coupling to move vertically along a connecting member.

17. A vacuum coupling system according to claim 15, wherein said beam member is formed of an elastic material such that the beam member itself can move straight.

18. A vacuum coupling system according to claim 15, wherein said centering mechanism includes at least a pair of elastic pressure applying mechanisms individually in unloaded contact with the opposite side faces of the movement drive mechanism in the neutral position.

19. A vacuum coupling system according to claim 15, wherein said centering mechanism is composed of a set of coil springs wound around the rotating shaft of the rotary support mechanism in opposite directions.

20. A vacuum coupling system according to claim 2, wherein said guide member is located under the valve mechanism.

21. A guide member used in the vacuum coupling system according to claim 3, comprising:

a recess in the center thereof; and a taper surface spreading outward from the recess.

22. A guide member used in the vacuum coupling system according to claim 12, comprising:

a recess formed in the central portion thereof;

a first taper surface spreading outward from the recess; and a second taper surface perpendicular to the first taper surface.

23. A guide member used in the vacuum coupling system according to claim 13, comprising:

a recess formed in the central portion thereof;

a taper surface spreading outward from the recess; and a guide groove formed in the taper surface and the recess.

24. A probing apparatus including a vacuum coupling system according to one of claim 1, 2 and 11, wherein said probing apparatus is used for an electrical property test and a reliability test on a plurality of semiconductor devices formed on the semiconductor wafer.

* * * * *